(12) United States Patent
Arai et al.

(10) Patent No.: US 12,163,987 B2
(45) Date of Patent: Dec. 10, 2024

(54) MEASUREMENT INDIVIDUAL DIFFERENCE CORRECTION SYSTEM IN GROUND VOLTAGE MEASUREMENT

(71) Applicant: Nippon Telegraph and Telephone Corporation, Tokyo (JP)

(72) Inventors: Naruto Arai, Musashino (JP); Ken Okamoto, Musashino (JP); Jun Kato, Musashino (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 269 days.

(21) Appl. No.: 17/796,151

(22) PCT Filed: Jan. 30, 2020

(86) PCT No.: PCT/JP2020/003409
§ 371 (c)(1),
(2) Date: Jul. 28, 2022

(87) PCT Pub. No.: WO2021/152768
PCT Pub. Date: Aug. 5, 2021

(65) Prior Publication Data
US 2023/0146777 A1    May 11, 2023

(51) Int. Cl.
*G01R 27/18* (2006.01)
*G01R 19/00* (2006.01)
(Continued)

(52) U.S. Cl.
CPC ......... *G01R 27/18* (2013.01); *G01R 19/0084* (2013.01); *G01R 27/16* (2013.01); *G01R 27/2605* (2013.01); *G01R 29/26* (2013.01)

(58) Field of Classification Search
CPC ........ G01R 27/18; G01R 27/16; G01R 27/20; G01R 27/2605; G01R 19/0053; G01R 19/10; G01R 19/0084; G01R 29/26
See application file for complete search history.

(56) References Cited

U.S. PATENT DOCUMENTS

2022/0057442 A1* 2/2022 Arai ................... G01R 29/085

OTHER PUBLICATIONS

Arai et al., "Ground Capacitance Estimating Method toward Simplified Grounding Measuring Equipment," 2019 IEICE General Conference, Correspondence Lecture Proceedings 1, Mar. 19, 2019, p. 264, 3 pages (with English Translation).
(Continued)

*Primary Examiner* — Amy He
(74) *Attorney, Agent, or Firm* — Fish & Richardson P.C.

(57) ABSTRACT

A measurement individual difference correction system for measuring voltage to ground includes a cable comprising a conductor, a floor panel provided on a floor and comprising a conductor, an oscillation circuit connected between the cable and the floor panel, and configured to output a signal, a voltage-to-ground measurement device comprising an upper electrode and a lower electrode positioned apart from each other, and configured to measure voltage between the upper electrode and the lower electrode, and a computation device in communication with the voltage-to-ground measurement device, in which the computation device calculates combined impedance of electrostatic capacity between the user and the cable, impedance of the user, and electrostatic capacity between the user and the upper electrode, by using voltage of the signal output from the oscillation circuit and the voltage between the upper electrode and the lower electrode measured by the voltage-to-ground measurement device.

5 Claims, 13 Drawing Sheets

(51) Int. Cl.
*G01R 27/16* (2006.01)
*G01R 27/26* (2006.01)
*G01R 29/26* (2006.01)

(56) References Cited

OTHER PUBLICATIONS

Kobayashi et al., "A Novel Non-contact Capacitive Probe for Common-Mode Voltage Measurement," IEICE Trans. Commun., 2007, E90-B(6):1329-1337.

* cited by examiner

MEASUREMENT INDIVIDUAL DIFFERENCE CORRECTION SYSTEM IN GROUND VOLTAGE MEASUREMENT

CROSS-REFERENCE TO RELATED APPLICATIONS

This application is a National Stage application under 35 U.S.C. § 371 of International Application No. PCT/JP2020/003409, having an International Filing Date of Jan. 30, 2020, the disclosure of which is considered part of the disclosure of this application, and is incorporated by reference in its entirety into this application.

TECHNICAL FIELD

The present invention is related to a measurement individual difference correction system for measuring voltage to round.

BACKGROUND ART

Devices such as communication devices and precision devices are usually connected with cables. For this reason, electromagnetic noise occurring in a certain device may propagate through a cable, and in some situations, the electromagnetic noise may enter another device being connected and, for example, cause communication disruption or slow down the communication speed. For example, there are incidences where electromagnetic noise occurring in a rapid charger for electric vehicles enters an ADSL communication cable and disrupts communication.

Electromagnetic noise is a type of electric signal and is invisible. For this reason, when communication trouble suspected of being caused by electromagnetic noise has occurred, a maintenance person carries out maintenance work by measuring electromagnetic noise by using a measurement device such as an oscilloscope. On such an occasion, because electromagnetic noise often forms a loop while using the earth ground as a return path, the voltage to ground of the electromagnetic noise is measured.

The voltage to ground denotes voltage between a conductor such as a cable and the earth ground or another conductor continuous with the earth ground. Generally speaking, a measurement device (hereinafter, "voltage-to-ground measurement device") such as an oscilloscope is grounded, and either a passive probe or a capacitive voltage probe (see Non-Patent Literature 1) of the voltage-to-ground measurement device is brought into contact with or clamped onto a cable subject to the measurement process, so as to measure the voltage to ground of the electromagnetic noise propagating through the cable. Alternatively, when it is difficult to have the voltage-to-ground measurement device grounded, the voltage to ground of the electromagnetic noise is measured without the grounding. Further, by using capacitance to ground measured by a capacitance-to-ground measurement device, a measurement error in the voltage to ground caused by the absence of the grounding is corrected, so as to obtain an accurate value of the voltage to ground (see Non-Patent Literature 2).

CITATION LIST

Non-Patent Literature

Non-Patent Literature 1: Kobayashi, R. and five others, "A Novel Non-contact Capacitive Probe for Common-Mode Voltage Measurement", IEICE TRANS. COMMUN., vol. E90-B, No. 6, June 2007, pp. 1329-1337

Non-Patent Literature 2: Arai and two others, "Sokuteiki no kan'iteki setchi ni muketa taichi seiden youryou no mitsumori shuhou no teian ('A proposal of a method for estimating electrostatic capacity to ground designed for conveniently grounding a measurement device' in Japanese)", the Institute of Electronics, Information and Communication Engineers (IEICE) General Conference 2019, Proceedings of Communications Conference 1, B-4-44, 2019, p. 264

SUMMARY OF THE INVENTION

Technical Problem

To simplify the work of measuring the voltage to ground, for example, it may be possible to use a configuration in which a voltage-to-ground measurement device is installed in the sole of one of a pair or shoes, whereas a capacitance-to-ground measurement device is installed in the sole of the other shoe. In this configuration, by simply touching the cable subject to the measurement process, a maintenance person is able to measure the voltage to ground of electromagnetic noise propagating through the cable subject to the measurement process.

In this situation, although the work of measuring the voltage to ground is simplified, because the human body functions as a probe, the measurement result of the voltage to ground is impacted by data amounts caused by the intervention of the human body, such as electrostatic capacity ($C_h$) between the cable and the human body, impedance ($Z_h$) of the human body, and electrostatic capacity ($C_f$) between the human body and the voltage-to-ground measurement device. In that situation, normally, a single general standard value corresponding to the data amounts is estimated in advance, so as to further correct the voltage to ground by using the standard value, in addition to correcting the voltage to ground by using capacitance to ground.

In the standard value, however, an individual difference of the maintenance person regarding $C_h$, $Z_h$, and $C_f$ are not taken into account. Further, Non-Patent Literature 2 merely discloses the method for estimating the capacitance to ground that is necessary in the correction of the voltage to ground. For this reason, there remains a problem that what can be measured is merely the voltage to ground of the electromagnetic noise for which the individual difference is ignored.

The present invention has been made in view of the circumstances described above, and it is an object of the present invention to provide a technique that makes it possible to correct a measurement error related to the individual difference of a human body that functions as a probe at the time of measuring the voltage to ground of electromagnetic noise.

Means for Solving the Problem

A measurement individual difference correction system for measuring voltage to ground according to an aspect of the present invention includes: a cable that is a conductor; a floor panel that is a conductor and is provided on a floor; an oscillation circuit that is connected between the cable and the floor panel and that outputs a signal; a voltage-to-ground measurement device that includes an upper electrode and a lower electrode positioned apart from each other and that measures voltage between the upper electrode and the lower electrode; and a computation device that communicates with the voltage-to-ground measurement device. When a user stands on the floor panel so that the lower electrode is directly connected to the floor panel and the user touches the cable while wearing a shoe of which a sole has the voltage-to-ground measurement device installed therein, the computation device calculates combined impedance of electrostatic capacity between the user and the cable, impedance of the user, and electrostatic capacity between the user and the upper electrode, by using voltage of the signal output from the oscillation circuit and the voltage between the upper electrode and the lower electrode measured by the voltage-to-ground measurement device.

A measurement individual difference correction system for measuring voltage to ground according to an aspect of the present invention includes: a cable that is a conductor; a counter earth ground surface electrode provided on a floor; an oscillation circuit that is connected between the cable and the counter earth ground surface electrode and that outputs a signal; a voltage-to-ground measurement device that includes an upper electrode and a lower electrode positioned apart from each other and that measures voltage between the upper electrode and the lower electrode; a capacitance-to-ground measurement device that measures capacitance to ground; and a computation device that communicates with the voltage-to-ground measurement device and the capacitance-to-ground measurement device. When a user touches the cable while wearing shoes of which a sole of one shoe has the voltage-to-ground measurement device installed therein and of which a sole of the other shoe has the capacitance-to-ground measurement device installed therein, the computation device calculates combined impedance of electrostatic capacity between the user and the cable, impedance of the user, and electrostatic capacity between the user and the upper electrode, by using voltage of the signal output from the oscillation circuit, the voltage between the upper electrode and the lower electrode measured by the voltage-to-ground measurement device, and the capacitance to ground measured by the capacitance-to-ground measurement device.

Effects of the Invention

According to the present invention, it is possible to provide the technique that makes it possible to correct the measurement error related to the individual difference of the human body that functions as a probe at the time of measuring the voltage to ground of electromagnetic noise.

DESCRIPTION OF EMBODIMENTS

Figure 1:
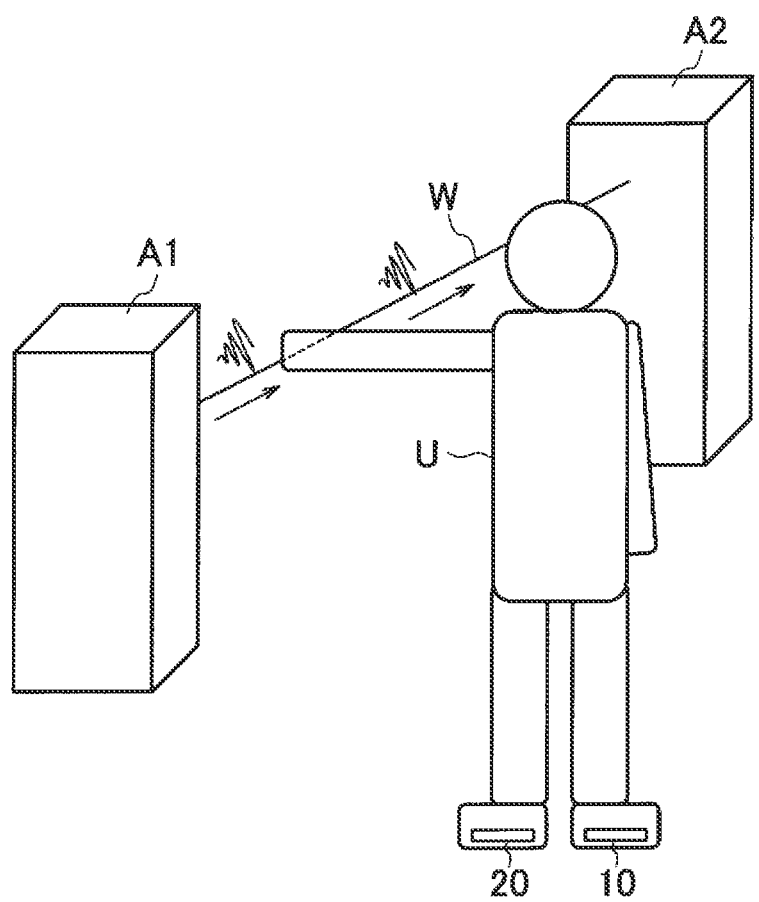
FIG. 1 is a drawing showing a configuration of a voltage-to-ground measurement system and a measurement concept assumed by the present invention.

Embodiments of the present invention will be explained below, with reference to the drawings. In the drawings, some of the elements that are the same as one another will be referred to by using mutually the same reference characters, and the explanations thereof will be omitted.

The present invention is an invention related to a technique for measuring the voltage to ground of electromagnetic noise propagating through a cable, without a maintenance person being concerned about the work of grounding a voltage-to-ground measurement device. In particular, the invention is related to a technique for correcting a measurement error related to an individual difference of a human body, with regard to a technique for measuring voltage to ground while using the human body as a probe.

<A Configuration of a Voltage-to-Ground Measurement System>

FIG. 1 is a drawing showing a configuration of a voltage-to-ground measurement system and a measurement concept assumed by the present invention. Two devices A1 and A2 are connected together by a coated cable W. It is assumed that electromagnetic noise is propagating from one of the devices A1 to the other device A2. In this situation, when a maintenance person U touches the cable W, it is possible to measure the voltage to ground of the electromagnetic noise, by using a voltage-to-ground measurement device 10 and a capacitance-to-ground measurement device 20 that are respectively installed in the two soles of a pair of shoes.

More specifically, when the maintenance person U touches the cable W or grips the cable W, an electric circuit is formed via the maintenance person U and the earth ground (the earth surface or the floor surface). As shown in the example in FIG. 2, the voltage-to-ground measurement device 10 has a four-layer structure including an upper electrode 11, a spacer, a lower electrode 12, and another spacer. The device has a mechanism in which a voltage measurement circuit 13 measures the voltage occurring between the upper electrode 11 and the lower electrode 12 (more accurately, the voltage occurring in a resistance element connected between the upper electrode 11 and the lower electrode 12). As a result of the voltage-to-ground measurement device 10 measuring the voltage between the upper electrode 11 and the lower electrode 12, it is possible to measure the voltage to ground of the electromagnetic noise propagating through the cable W.

Figure 3:
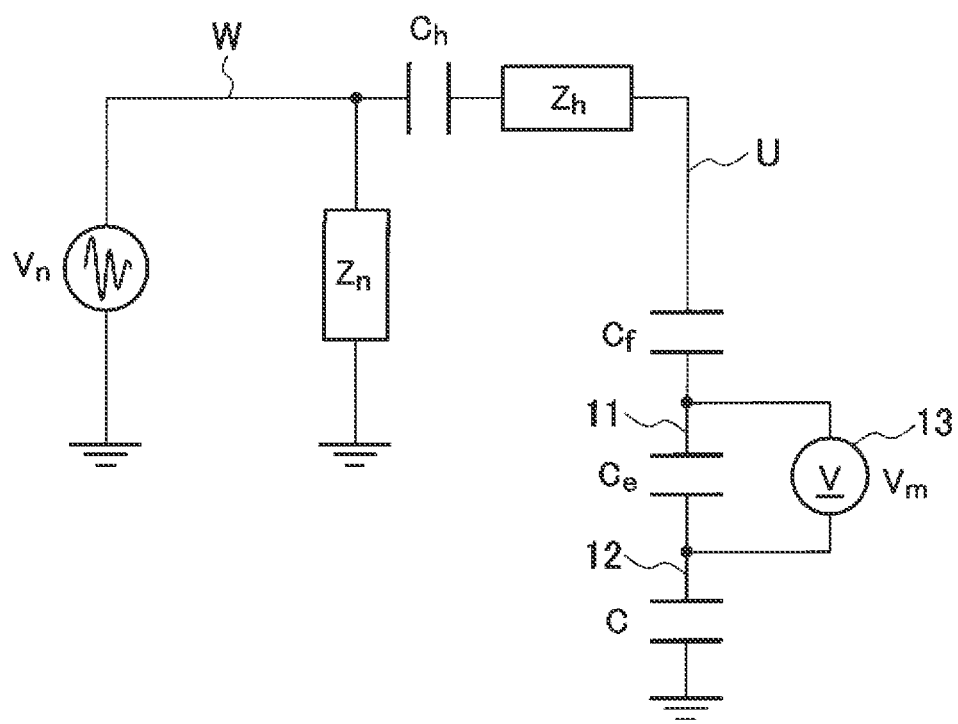
FIG. 3 is a drawing showing an equivalent circuit of FIG. 1.

An equivalent circuit of FIG. 1 is shown in FIG. 3. The symbol C denotes electrostatic capacity (=capacitance to ground) between the lower electrode 12 of the voltage-toground measurement device 10 and the earth ground or a conductor continuous with the earth ground. The symbol $C_e$ denotes electrostatic capacity between the upper electrode 11 and the lower electrode 12 of the voltage-to-ground measurement device 10. The symbol $C_f$ denotes electrostatic capacity between the sole of the foot of the maintenance person U and the upper electrode 11 of the voltage-to-ground measurement device 10. The symbol $Z_h$ denotes impedance of the maintenance person U. The symbol $C_h$ denotes electrostatic capacity between a hand of the maintenance person U and the cable W gripped by the hand of the maintenance person U. The symbol $Z_n$ denotes impedance in the electric circuit path through which the electromagnetic noise is flowing. The symbol $V_n$ denotes the voltage to ground of the electromagnetic noise to be measured. The symbol $V_m$ denotes the voltage measured by the voltage measurement circuit 13 of the voltage-to-ground measurement device 10.

The voltage-to-ground measurement device 10 is able to obtain the voltage to ground ($V_n$) of the electromagnetic noise to be measured, through a calculation where the electrostatic capacity values (C, $C_e$, $C_f$, and $C_h$), the impedance values ($Z_h$ and $Z_n$), and the voltage ($V_m$) described above are assigned to Expression (1) presented below. It should be noted that $Z_n$ is ignored because the value thereof is generally small. Further, the symbol $Z_m$ denotes combined impedance of $C_h$, $Z_h$, and $C_f$.

[Math. 1]

$$V_n = V_m \frac{Z_m + j\omega C_e + j\omega C}{j\omega C_e} \quad (1)$$

In Expression (1), the symbol $C_e$ denotes a known Parameter value determined by a designer of the voltage-to-ground measurement device 10. Further, it is possible to measure C by using the capacitance-to-ground measurement device 20 that measures capacitance to ground (see Non-Patent Literature 2).

Figure 4:
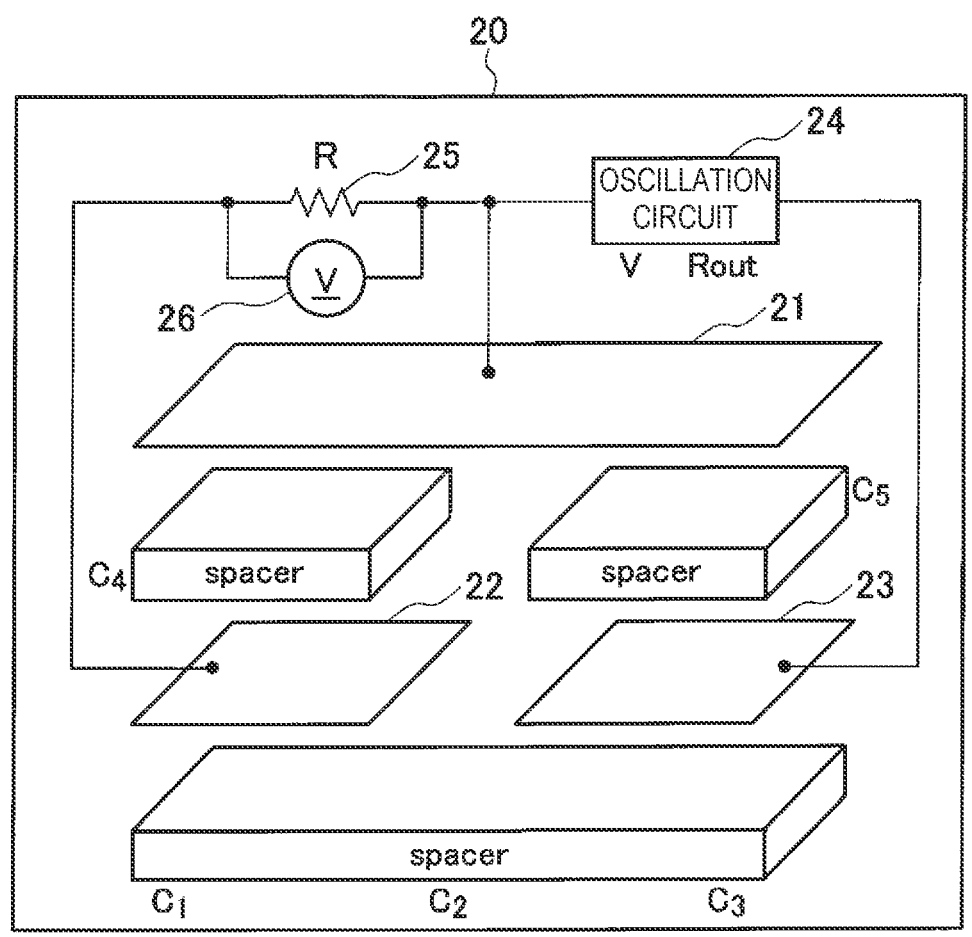
FIG. 4 is a drawing showing a configuration of a capacitance-to-ground measurement device.

Next, the capacitance-to-ground measurement device 20 will be explained. As shown in FIG. 4, the capacitance-to-ground measurement device 20 is structured with an upper electrode 21, a first lower electrode 22 and a second lower electrode 23 provided as a set of two electrodes, spacers inserted between the electrodes, an oscillation circuit 24, a resistance element 25, and a voltage measurement circuit 26. The first lower electrode 22 and the second lower electrode 23 are both installed so as to face the earth ground serving as a reference potential.

In this situation, output voltage V of the oscillation circuit 24, output resistance $R_{out}$ of the oscillation circuit 24, resistance R of the resistance element 25, electrostatic capacity $C_4$ between the upper electrode 21 and the first lower electrode 22, and electrostatic capacity $C_5$ between the upper electrode 21 and the second lower electrode 23 are known parameter values determined by a designer of the capacitance-to-ground measurement device 20. Further, it is possible to design electrostatic capacity $C_1$ between the first lower electrode 22 and the earth ground, electrostatic capacity $C_2$ between the upper electrode 21 and the earth ground, and electrostatic capacity $C_3$ between the second lower electrode 23 and the earth ground, as values that can be expressed by using one variable. Further, when the capacitance-to-ground measurement device 20 approaches the earth ground, the values of $C_1$ to $C_3$ increase, and the voltage occurring in the resistance element 25 when a signal is output from the oscillation circuit 24 increases.

Thus, by using the notion that the values of $C_1$ to $C_3$ can be expressed by the one variable, it is possible to estimate the values of $C_1$ to $C_3$ from the voltage occurring in the resistance element 25 on the basis of Kirchhoff's laws. Accordingly, the capacitance-to-ground measurement device 20 is able to measure the capacitance to ground. Alternatively, the capacitance-to-ground measurement device 20 may be installed as a stationary device, instead of being installed in the sole of the other shoe. Further, as long as the capacitance-to-ground measurement device 20 is capable of measuring the capacitance to ground, configurations other than the configuration shown in FIG. 4 may be used.

Returning to the explanation of Expression (1), the symbols $C_e$ and C in Expression (1) represent values that can be defined. In contrast, the symbol $Z_m$ denotes the combined impedance of $C_h$, $Z_h$, and $C_f$ and represents a value that varies among individuals. For this reason, conventional techniques have only been able to use a predetermined single general standard value, which are unable to take the individual difference of the maintenance person U into account.

To cope with this situation, the present invention makes it possible to correct a measurement error related to the individual difference of the maintenance person U, by measuring, with respect to each user U representing the maintenance person U, a value of the combined impedance ($Z_m$) of $C_h$, $Z_h$, and $C_f$ in advance, so as to calculate $V_n$ by assigning the value of $Z_m$ of the maintenance person U who performs the measurement process to Expression (1), at the time of measuring the voltage to ground.

Next, two embodiments of the present invention will be explained. In a first embodiment, a measurement individual difference correction system of a stationary type will be explained. In a second embodiment, a measurement individual difference correction system of a portable type will be explained.

First Embodiment

<A Configuration of the Measurement Individual Difference Correction System According to the First Embodiment>

Figure 5:
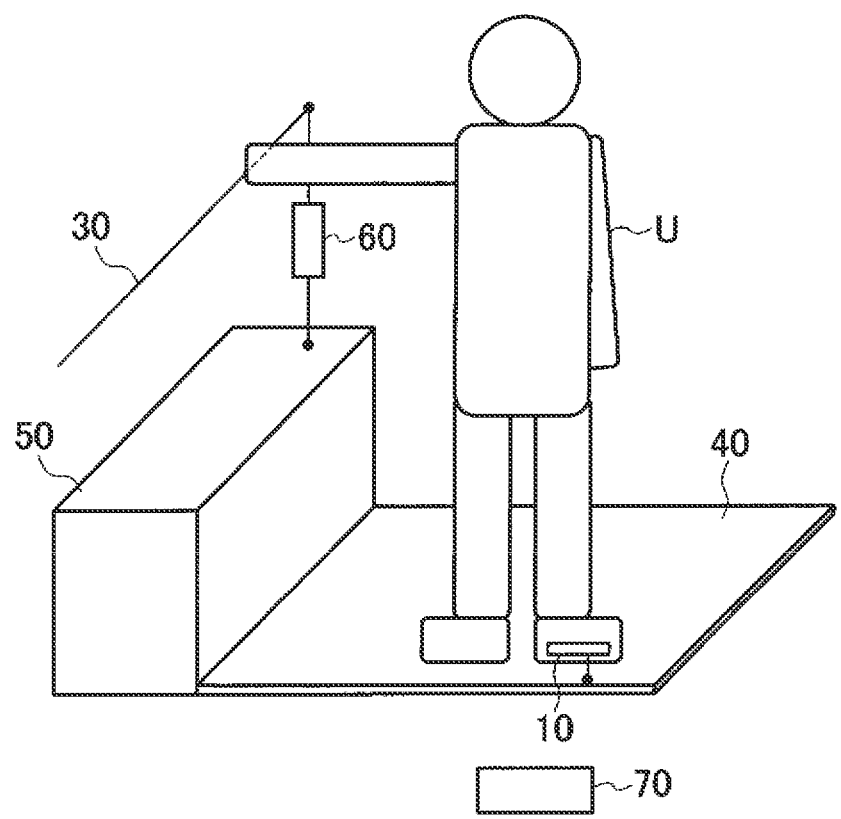
FIG. 5 is a drawing showing a configuration of a measurement individual difference correction system and a measurement concept according to a first embodiment.

FIG. 5 is a drawing showing a configuration of the measurement individual difference correction system and a measurement concept according to the first embodiment. The measurement individual difference correction system is structured with a grip cable 30, a floor panel 40, a height adjustment table 50, an oscillation circuit 60, the voltage-to-ground measurement device 10, and a computation device 70. In the first embodiment, because there is no need to use capacitance to ground since the lower electrode 12 of the voltage-to-ground measurement device 10 is directly connected to the floor panel 40, the capacitance-to-ground measurement device 20 will not be used.

The grip cable 30 is a conductor cable to be gripped by the user U.

The floor panel 40 is a conductor panel provided on the floor.

The height adjustment table 50 is a conductor pedestal which is provided on the floor, is taller than the floor panel 40, is electrically connected to the floor panel 40, and is used for adjusting the heights of the grip cable 30 and the oscillation circuit 60.

Figure 6:
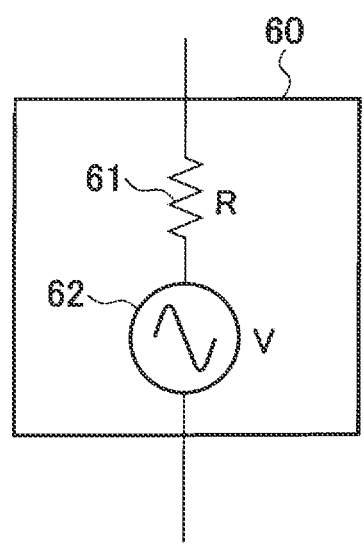
FIG. 6 is a drawing showing a configuration of an oscillation circuit.

The oscillation circuit 60 is a circuit that is connected between the grip cable 30 and the height adjustment table 50 and that outputs a signal having a prescribed frequency. As shown in FIG. 6, the oscillation circuit 60 has a structure in which a resistance element 61 and an oscillator 62 are connected in series.

Figure 2:
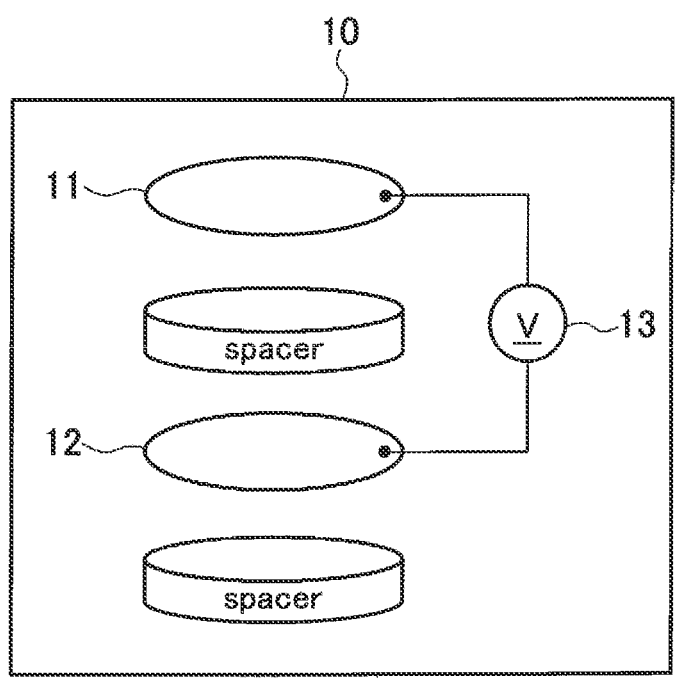
FIG. 2 is a drawing showing a configuration of a voltage-to-ground measurement device.

As shown in FIG. 2, the voltage-to-ground measurement device 10 is a device that includes the upper electrode 11 and the lower electrode 12 positioned apart from each other, measures the voltage between the upper electrode 11 and the lower electrode 12 by using the voltage measurement circuit 13, and transmits the measured voltage resulting from the measurement process to the computation device 70 in a wired or wireless manner. The voltage-to-ground measurement device 10 is installed in the sole of one of the shoes of the user U.

Further, the voltage-to ground measurement device 10 has stored therein the combined impedance ($Z_m$) of each user U calculated by the computation device 70. Further, when the maintenance person (=the prescribed user) U measures the voltage to ground of the electromagnetic noise propagating through the cable W subject to the measurement process, the voltage-to-ground measurement device 10 calculates the voltage to ground ($V_n$) of the electromagnetic noise, by changing the voltage ($V_m$) between the upper electrode 11 and the lower electrode 12 measured at the time of the measurement process, with the use of the value of $Z_m$ of the maintenance person U.

The computation device 70 is a device that communicates with the voltage-to-ground measurement device 10. Further, when the user U stands on the floor panel 40 so that the lower electrode 12 is directly connected to the floor panel 40 and the user U touches the grip cable 30 while wearing the shoe of which the sole has the voltage-to-ground measurement device 10 installed therein, the computation device 70 calculates the combined impedance ($Z_m$) in the following manner: The computation device 70 calculates the combined impedance ($Z_m$) of the electrostatic capacity ($C_h$) between the hand of the user U and the grip cable 30, the impedance ($Z_h$) of the user U, and the electrostatic capacity ($C_f$) between the sole of the foot of the user U and the upper electrode 11, by using the voltage (V) of the signal output from the oscillation circuit 60 and the voltage ($V_m$) between the upper electrode 11 and the lower electrode 12 measured by the voltage-to-ground measurement device 10.

<A Method for Calculating the Combined Impedance Implemented in the First Embodiment>

While wearing the voltage-to-ground measurement device 10 implemented in the form of the shoe, the user U stands on the floor panel 40 and grips the grip cable 30. In this situation, the floor panel 40 is electrically connected to the height adjustment table 50. One end of the grip cable 30 is connected to an output side of the oscillation circuit 60, whereas the other end of the grip cable 30 is not electrically connected anywhere and is in an open state. A ground side of the oscillation circuit 60 is connected to the height adjustment table 50. The lower electrode 12 of the voltage-to-ground measurement device 10 worn by the user U is directly connected to the floor and 40 physically. The floor panel 40 and the height adjustment table 50 are each made of a conductive material (e.g., aluminum).

Figure 7:
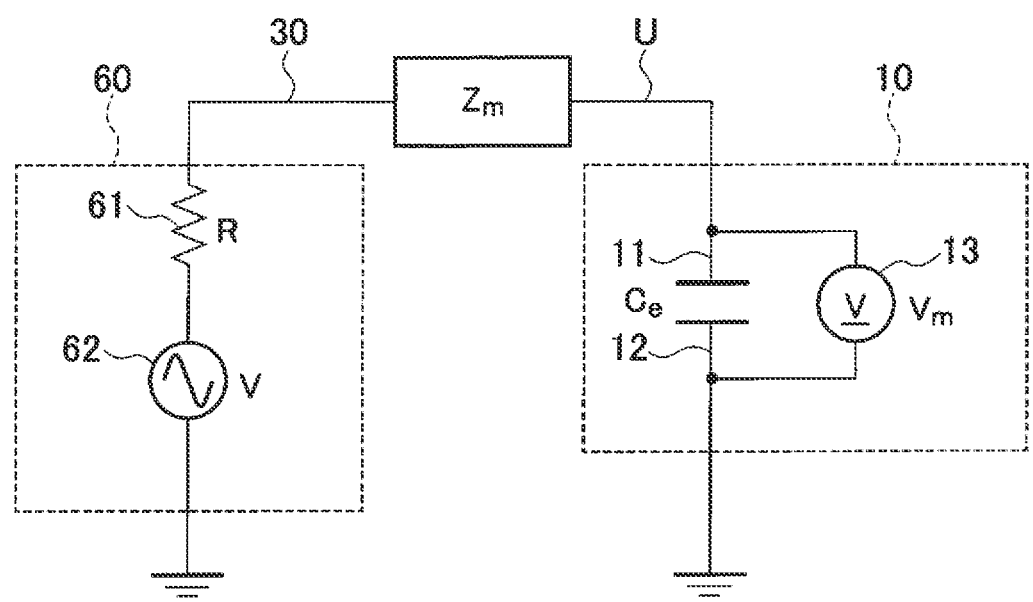
FIG. 7 is a drawing showing an equivalent circuit of FIG. 5.

An equivalent circuit expressing the state described above is shown in FIG. 7. It is possible to express the voltage ($V_m$) between the upper electrode 11 and the lower electrode 12 measured by the voltage-to-ground measurement device 10, by using Expression (2) presented below.

[Math. 2]

$$V_m = V \frac{j\omega C_e}{R + Z_m + j\omega C_e} \quad (2)$$

The symbol $Z_m$ denotes the combined impedance of the electrostatic capacity ($C_h$) between the hand of the user U and the grip cable 30, the impedance ($Z_h$) of the user U, and the electrostatic capacity ($C_f$) between the sole of the foot of the user U and the upper electrode 11. The symbol V denotes the output voltage of the oscillator 62 included in the oscillation circuit 60. The symbol R denotes an output resistance value of the resistance element 61 included in the oscillation circuit 60. The symbol $C_e$ denotes the electrostatic capacity between the upper electrode 11 and the lower electrode 12 of the voltage-to-ground measurement device 10. By using the relationship among the variables expressed in Expression (2), it is possible to obtain $Z_m$ by using Expression (3) presented below.

[Math. 3]

$$Z_m = \left(\frac{V - V_m}{V_m}\right) j\omega C_e - R \quad (3)$$

The computation device 70 is used for performing the calculation in Expression (3). The computation device 70 is communicably connected to the oscillation circuit 60 and the voltage-to-ground measurement device 10 in a wired or wireless manner. The computation device 70 performs the calculation in Expression (3) by using the output voltage (V) of the signal output from the oscillation circuit 60 and the measured voltage ($V_m$) measured by the voltage-to-ground measurement device 10. Further, by sweeping an oscillation frequency of the oscillation circuit 60, the computation device 70 measures not only the combined impedance ($Z_m$) at a single frequency, but also frequency characteristics of the combined impedance.

Subsequently, the computation device 70 transmits frequency characteristic data of the combined impedance ($Z_m$) of each user obtained as measurement results, to the voltage-to-ground measurement device 10. The voltage-to-ground measurement device 10 has stored therein the value of $Z_m$ of each user U so as to be kept in association with a user ID. Further, in the voltage-to-ground measurement system shown in FIG. 1, when the maintenance person U measures the voltage to ground of the electromagnetic noise propagating through the cable W, the voltage-to-ground measurement device 10 obtains the voltage to ground ($V_m$) of the electromagnetic noise by assigning the value of $Z_m$ of the maintenance person U to Expression (1) and thereby makes it possible to correct the measurement error related to the individual difference of the human body.

Figure 8:
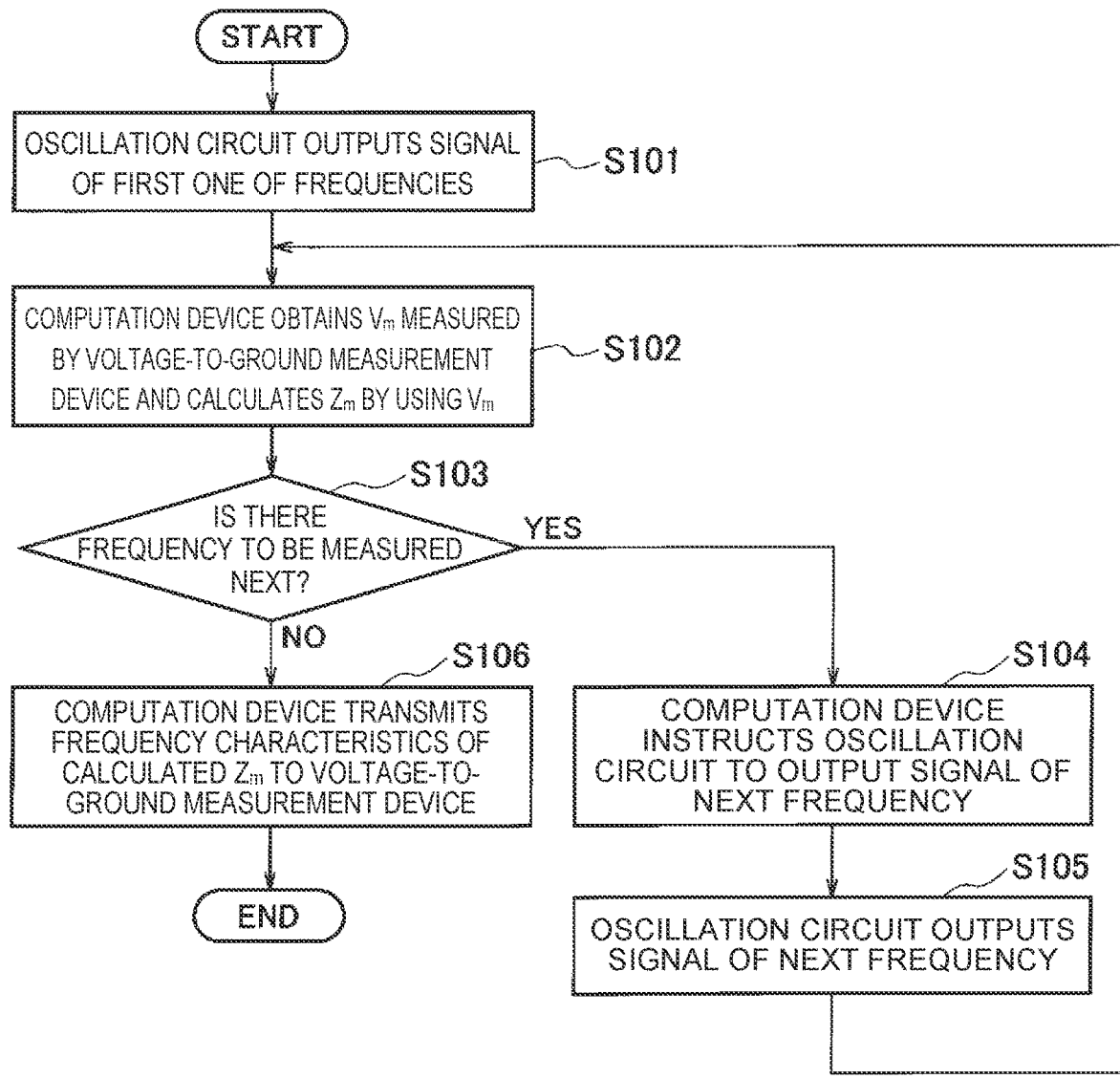
FIG. 8 is a drawing showing a processing flow of the measurement individual difference correction system according to the first embodiment.

Next, a flow in the operation to measure the combined impedance ($Z_m$) will be explained. FIG. 8 is a drawing showing a processing flow of the measurement individual difference correction system according to the first embodiment. The processes in the processing flow are performed with respect to each user.

Step S101:
First, the oscillation circuit 60 outputs a signal of the first one of frequencies.

Step S102:
After that, the computation device 70 assigns the output voltage (V) of the signal output from the oscillation circuit 60 and the measured voltage ($V_m$) measured by the voltage-to-ground measurement device 10 to Expression (3), and also assigns the electrostatic capacity ($C_e$) between the upper electrode 11 and the lower electrode 12 of the voltage-to-ground measurement device 10 and the output resistance value (R) of the resistance element 61 of the oscillation circuit 60, which are default values, to Expression (3). In this manner, the computation device 70 calculates the combined impedance ($Z_m$) of the electrostatic capacity ($C_h$) between the hand of the user U and the grip cable 30, the impedance ($Z_h$) of the user U, and the electrostatic capacity ($C_f$) between the sole of the foot of the user U and the upper electrode 11.

Step S103:

Subsequently, the computation device 70 determines whether or not there is an unmeasured frequency among the plurality of frequencies that are predetermined. When there is at least one unmeasured frequency, the process proceeds to step S104. On the contrary, when there is no unmeasured frequency, the process proceeds to step S106.

Step S104:

When there is at least one unmeasured frequency, the computation device 70 instructs the oscillation circuit 60 to output a signal of the next frequency.

Step S105:

After that, on the basis of the instruction from the computation device 70 to output the signal, the oscillation circuit 60 outputs the signal of the next frequency, and the process returns to step S102.

Step S106:

When there is no unmeasured frequency, the computation device 70 transmits the measured combined impedance ($Z_m$) of each of the frequencies to the voltage-to-ground measurement device 10 and thus ends the process.

Subsequently, the voltage-to-ground measurement device 10 has stored therein the frequency characteristics of the combined impedance ($Z_m$) of each user transmitted thereto from the computation device 70, so as to be kept in association with the ID of the user U. When the maintenance person U measures the voltage to ground of the electromagnetic noise, the voltage-to-ground measurement device 10 obtains the voltage to ground ($V_n$) of the electromagnetic noise for which the measurement error related to the individual difference of the human body has been corrected, by assigning the combined impedance ($Z_m$) of the maintenance person U to Expression (1) and changing the measured voltage ($V_m$) between the upper electrode 11 and the lower electrode 12 measured at the time of the measurement process.

A Modification Example of the First Embodiment

Figure 9:
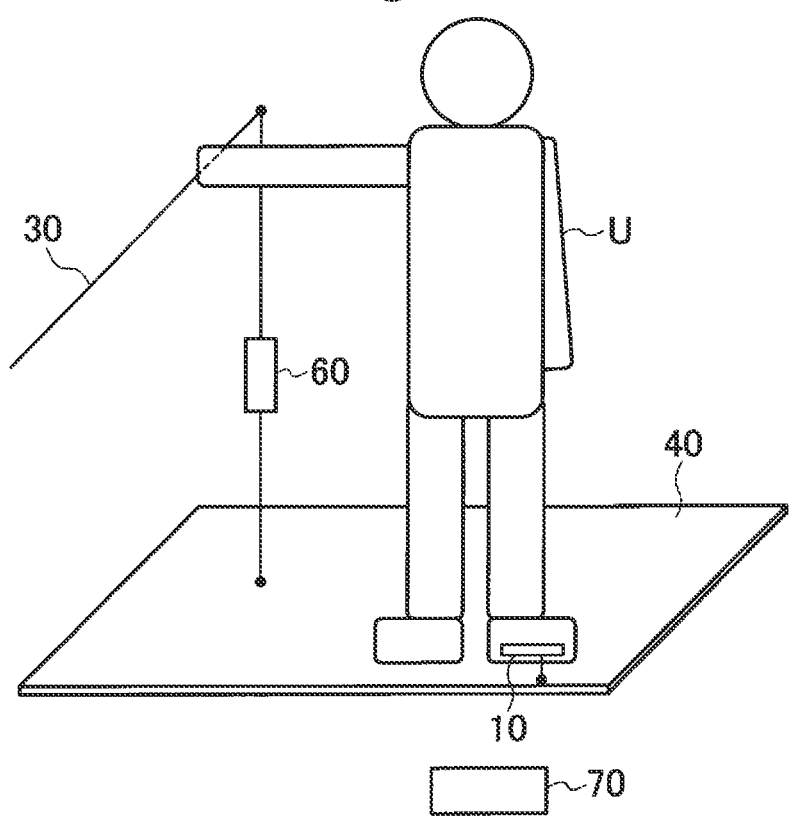
FIG. 9 is a drawing showing (a modification example of) the configuration of the measurement individual difference correction system and the measurement concept according to the first embodiment.

The example was explained above in which the height adjustment table 50 is used; however, when there is no need to adjust the heights of the grip cable 30 and the oscillation circuit 60, it is also acceptable to directly connect the oscillation circuit 60 to the floor panel 40, as shown in FIG. 9.

Advantageous Effects of the First Embodiment

According to the first embodiment, provided are: the grip cable 30 that is a conductor; the floor panel 40 that is a conductor and is provided on the floor; the height adjustment table 50 that is a conductor, is provided on the floor, is taller than the floor panel 40, and is electrically connected to the floor panel 40; the oscillation circuit 60 that is connected between the grip cable 30 and the height adjustment table 50 and that outputs the signal having the prescribed frequency; the voltage-to-ground measurement device 10 that includes the upper electrode 11 and the lower electrode 12 positioned apart from each other and that measures the voltage between the upper electrode 11 and the lower electrode 12; and the computation device 70 that communicates with the voltage-to-ground measurement device 10. When the user U stands on the floor panel 40 so that the lower electrode 12 is directly connected to the floor panel 40 physically and the user U touches the grip cable 30 while wearing the shoe of which the sole has the voltage-to-ground measurement device 10 installed therein, the computation device 70 calculates the combined impedance ($Z_m$) of the electrostatic capacity ($C_h$) between the hand of the user U and the grip cable 30, the impedance ($Z_h$) of the user U, and the electrostatic capacity ($C_f$) between the sole of the foot of the user U and the upper electrode 11, by using the voltage (V) of the signal output from the oscillation circuit 60 and the voltage ($V_m$) between the upper electrode 11 and the lower electrode 12 measured by the voltage-to-ground measurement device 10. It is therefore possible to provide the technique that makes it possible to correct the measurement error related to the individual difference of the human body that functions as a probe at the time of measuring the voltage to ground of the electromagnetic noise. As a result, it is possible to measure the voltage to ground of the electromagnetic noise with a higher level of precision.

Second Embodiment

In the second embodiment, a measurement individual difference correction system is configured as a portable type, in contrast to the system of the stationary type in the first embodiment. The biggest problem of the portable type is that, because the floor panel 40 cannot be used, it is impossible to have the lower electrode 12 of the voltage-to-ground measurement device 10 directly connected to the floor panel 40 physically. Accordingly, in the second embodiment, the problem is solved by using the capacitance-to-ground measurement device 20 that measures the capacitance to ground.

<A Configuration of the Measurement Individual Difference Correction System According to the Second Embodiment>

Figure 10:
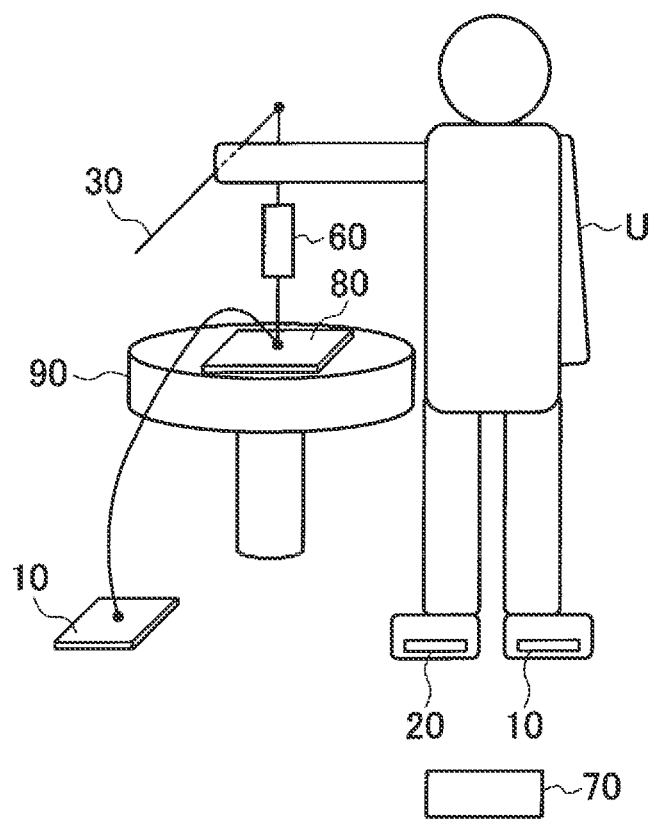
FIG. 10 is a drawing showing a configuration of a measurement individual difference correction system and a measurement concept according to a second embodiment.

FIG. 10 is a drawing showing a configuration of the measurement individual difference correction system and a measurement concept according to the second embodiment. The measurement individual difference correction system is structured with the grip cable 30, the oscillation circuit 60, a pedestal 80, a desk 90, a counter earth ground surface electrode 100, the voltage-to-ground measurement device 10, the capacitance-to-ground measurement device 20, and the computation device 70.

The grip cable 30 is a conductor cable gripped by the user U.

The oscillation circuit 60 is a circuit that is connected between the grip cable 30 and the counter earth ground surface electrode 100 and that outputs a signal having a prescribed frequency. As shown in FIG. 6, the oscillation circuit 60 has a structure in which the resistance element 61 and the oscillator 62 are connected in series.

The pedestal 80 is a pedestal disposed on the desk 90 and used for adjusting the heights of the grip cable 30 and the oscillation circuit 60. The pedestal 80 may be a conductor or may be a non-conductor.

The desk 90 is a desk provided on the floor and is used for adjusting the heights of the grip cable 30 the oscillation circuit 60. The desk 90 may be a conductor or may be a non-conductor.

The counter earth around surface electrode 100 is an electrode provided on the floor. The counter earth ground surface electrode 100 is connected to the oscillation circuit 60 by a conductor cable. When the pedestal 80 and the desk 90 are each a conductor, the counter earth ground surface electrode 100 may be connected to the desk 90.

As shown in FIG. 2, the voltage-to-ground measurement device 10 is a device that includes the upper electrode 11 and the lower electrode 12 positioned apart from each other, measures the voltage between the upper electrode 11 and the lower electrode 12 by using the voltage measurement circuit 13, and transmits the measured voltage resulting from the measurement process to the computation device 70 in a wired or wireless manner. The voltage-to-ground measurement device 10 is installed in the sole of one of the shoes of the user U.

Further, the voltage-to-ground measurement device 10 has stored therein the combined impedance ($Z_m$) of each user U calculated by the computation device 70. Further, when the maintenance person (=the prescribed user) U measures the voltage to ground of the electromagnetic noise propagating through the cable W subject to the measurement process, the voltage-to-ground measurement device 10 calculates the voltage to ground ($V_n$) of the electromagnetic noise, by changing the voltage ($V_m$) between the upper electrode 11 and the lower electrode 12 measured at the time of the measurement process, with the use of the value of $Z_m$ of the maintenance person U.

As shown in FIG. 4, the capacitance-to-ground measurement device 20 includes the upper electrode 21, the first lower electrode 22 and the second lower electrode 23 provided as a set of two electrodes, the spacers inserted between the electrodes, the oscillation circuit 24, the resistance element 25, and the voltage measurement circuit 26. Further, the capacitance-to-ground measurement device 20 measures one value of capacitance to ground corresponding to total electrostatic capacity made up of the electrostatic capacity $C_1$ between the first lower electrode 22 and the earth ground, the electrostatic capacity $C_2$ between the upper electrode 21 and the earth around, and the electrostatic capacity $C_3$ between the second lower electrode 23 and the earth ground, and further transmits the measured capacitance to ground to the computation device 70 in a wired or wireless manner. The voltage-to-ground measurement device 10 is installed in the sole of the other shoe of the user U.

The computation device 70 is a device that communicates with the voltage-to-ground measurement device 10 and the capacitance-to-ground measurement device 20. Further, when the user U touches the grip cable 30 while wearing the shoes of which the sole of one shoe has the voltage-to-ground measurement device 10 installed herein and of which the sole of the other shoe has the capacitance-to-ground measurement device 20 installed therein, the computation device 70 calculates the combined impedance ($Z_m$) in the following manner: The computation device 70 calculates the combined impedance ($Z_m$) of the electrostatic capacity ($C_h$) between the hand of the user U and the grip cable 30, the impedance ($Z_h$) of the user U, and the electrostatic capacity ($C_f$) between the sole of the foot of the user U and the upper electrode 11, by using the voltage (V) of the signal output from the oscillation circuit 60, the voltage ($V_m$) between the upper electrode 11 and the lower electrode 12 measured by the voltage-to-ground measurement device 10, and the capacitance to ground measured by the capacitance-to-ground measurement device 20.

<A Method for Calculating the Combined Impedance Implemented in the Second Embodiment>

The user U grips the grip cable 30 while wearing the voltage-to-ground measurement device 10 implemented in the form of the shoe. In this situation, the grip cable 30 and the oscillation circuit 60 are provided on the pedestal 80 and the desk 90 having appropriate sizes so as to be easily gripped by the user U. In the second embodiment, the grip cable 30 and the oscillation circuit 60 are used like in the first embodiment, but the floor panel 40 and the height adjustment table 50 are not used. Further, the counter earth ground surface electrode 100, which is not used in the first embodiment, is connected to the ground side of the oscillation circuit 60. Further, the pedestal 80 is provided to facilitate placement on the desk or the like. The counter earth ground surface electrode 100 is installed so as to be horizontal on the earth ground surface.

Figure 11:
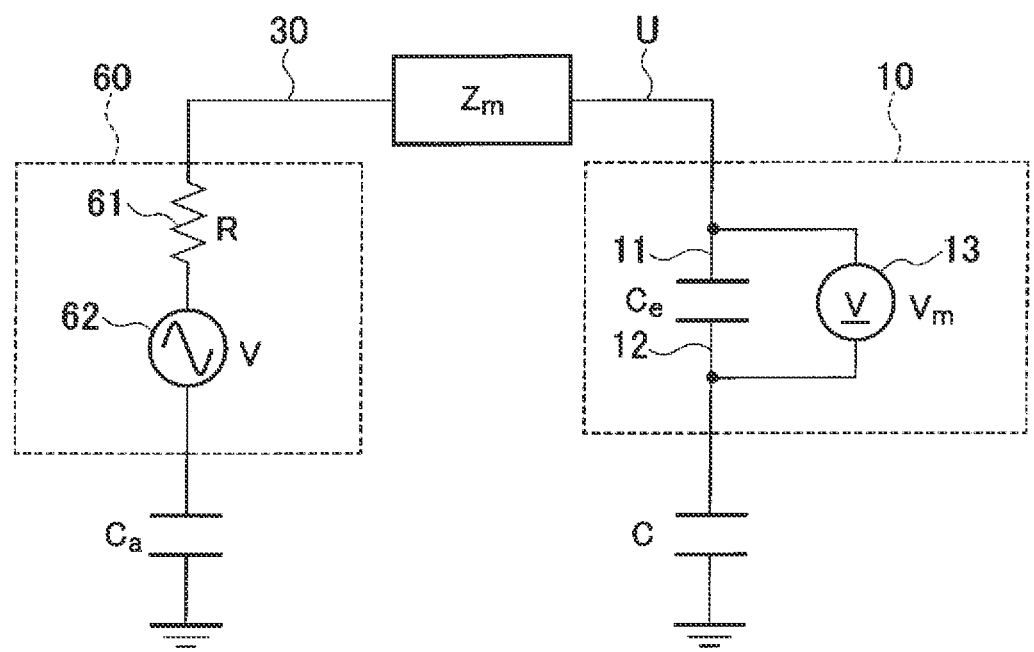
FIG. 11 is a drawing showing an equivalent circuit of FIG. 10.

An equivalent circuit expressing the state described above is shown in FIG. 11. It is possible to express the measured voltage ($V_m$) between the upper electrode 11 and the lower electrode 12 measured by the voltage-to-ground measurement device 10 by using Expression (4) presented below.

[Math. 4]

$$V_m = V \frac{j\omega C_e}{R + Z_m + j\omega C_e + j\omega C + j\omega C_a} \quad (4)$$

The symbol $Z_m$ denotes the combined impedance of the electrostatic capacity ($C_h$) between the hand of the user U and the grip cable 30, the impedance ($Z_h$) of the user U, and the electrostatic capacity ($C_f$) between the sole of the foot of the user U and the upper electrode 11. The symbol V denotes the output voltage of the oscillator 62 included in the oscillation circuit 60. The symbol R denotes an output resistance value of the resistance element 61 included in the oscillation circuit 60. The symbol $C_e$ denotes the electrostatic capacity between the upper electrode 11 and the lower electrode 12 of the voltage-to-ground measurement device 10. The symbol C denotes electrostatic capacity (=capacitance to ground) between the earth ground or a conductor continuous with the earth ground and the lower electrode 12 of the voltage-to-ground measurement device 10. The symbol $C_a$ denotes electrostatic capacity (=capacitance to ground) between the earth ground or a conductor continuous with the earth ground and the counter earth ground surface electrode 100. It is possible to measure C and $C_a$ by using the capacitance-to-ground measurement device 20. By using the relationship among the variables expressed in Expression (4), it is possible to obtain $Z_m$ by using Expression (5) presented below.

[Math. 5]

$$Z_m = \left(\frac{V - V_m}{V_m}\right) j\omega C_e - j\omega C - j\omega C_a - R \quad (5)$$

The computation device 70 is used for performing the calculation in Expression (5). The computation device 70 is communicably connected to the oscillation circuit 60, the voltage-to-ground measurement device 10, and the capacitance-to-ground measurement device 20, in a wired or wireless manner. The computation device 70 performs the calculation in Expression (5) by using the output voltage (V) of the signal output from the oscillation circuit, the measured voltage ($V_m$) measured by the voltage-to-ground measurement device 10, and the capacitance to ground (=the electrostatic capacity values C and $C_a$) measured by the capacitance-to-ground measurement device 20. Further, by sweeping an oscillation frequency of the oscillation circuit 60, the computation device 70 measures not only the combined impedance at a single frequency, but also frequency characteristics of the combined impedance.

Subsequently, the computation device 70 transmits frequency characteristic data of the combined impedance ($Z_m$) of each user obtained as measurement results, to the voltage-to-ground measurement device 10. The voltage-to-ground measurement device 10 has stored therein the value of $Z_m$ of each user U so as to be kept in association with a user ID. Further, in the voltage-to-ground measurement system shown in FIG. 1, when the maintenance person U measures the voltage to ground of the electromagnetic noise propagating through the cable W, the voltage-to-ground measurement device 10 obtains the voltage to ground ($V_n$) of the electromagnetic noise by assigning the value of $Z_m$ of the maintenance person U to Expression (1) and thereby makes it possible to correct the measurement error related to the individual difference of the human body.

Figure 12:
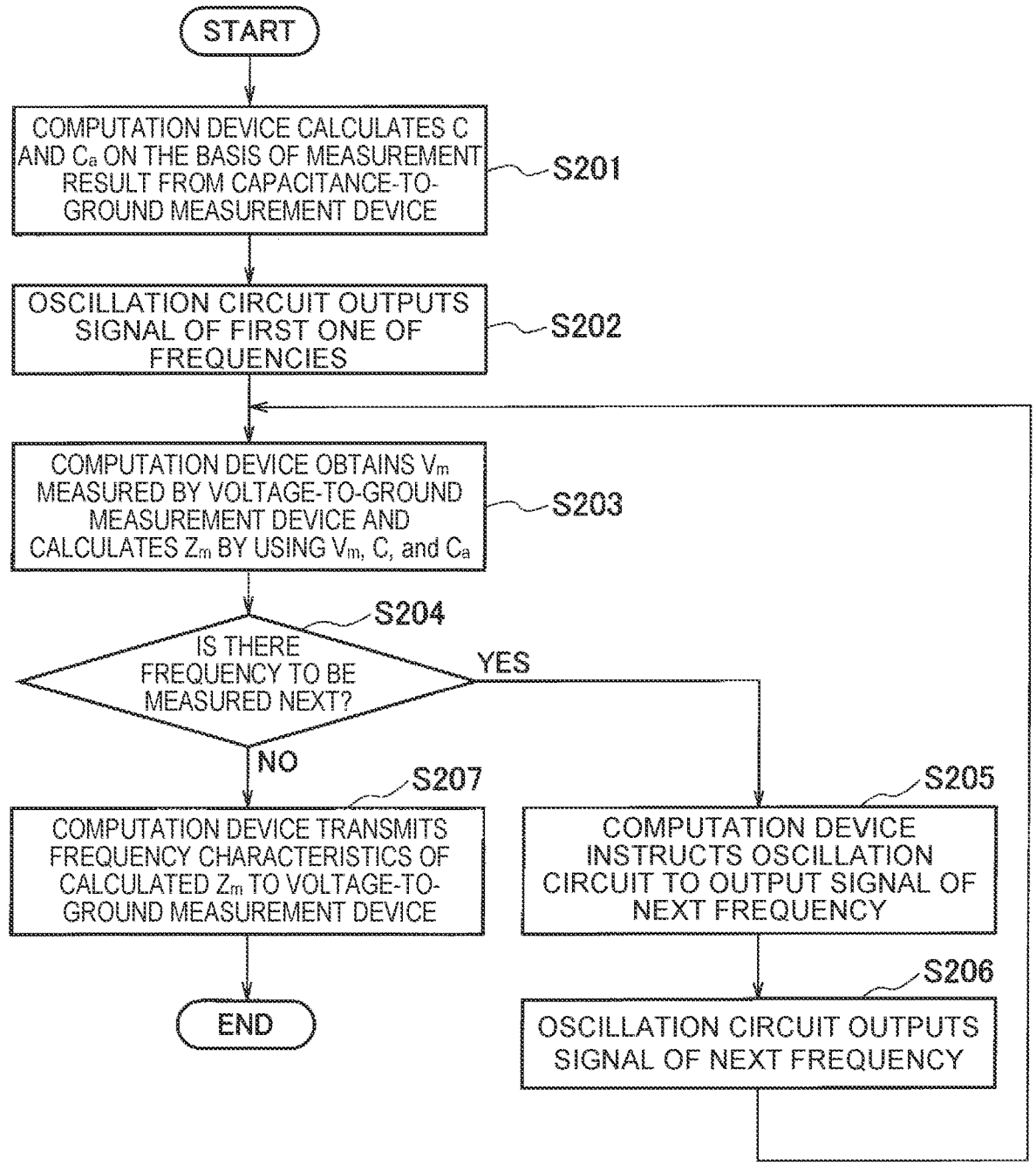
FIG. 12 is a drawing showing a processing flow of the measurement individual difference correction system according to the second embodiment.

Next, a flow in the operation to measure the combined impedance ($Z_m$) will be explained. FIG. 12 is a drawing showing a processing flow of the measurement individual difference correction system according to the second embodiment. The processes in the processing flow are performed with respect to each user.

Step S201:

First, the computation device 70 receives the capacitance to ground measured by the capacitance-to-ground measurement device 20 and regards the received capacitance to ground as the electrostatic capacity (C) between the earth ground or a conductor continuous with the earth ground and the lower electrode 12 of the voltage-to-ground measurement device 10 and as the electrostatic capacity ($C_a$) between the earth ground or a conductor continuous with the earth ground and the counter earth ground surface electrode 100. In this situation, the computation device 70 may regard a value adjusted, for example, by multiplying the capacitance to ground measured by the capacitance-to-ground measurement device 20 by a prescribed value as the electrostatic capacity values (C and $C_a$).

Step S202:

Subsequently, the oscillation circuit 60 outputs a signal of the first one of frequencies.

Step S203:

After that, the computation device 70 assigns the output voltage (V) of the signal output from the oscillation circuit 60, the measured voltage ($V_m$) measured by the voltage-to-ground measurement device 10, and the electrostatic capacity values (C and $C_a$) obtained at step S201 to Expression (5), and also assigns the electrostatic capacity ($C_e$) between the upper electrode 11 and the lower electrode 12 of the voltage-to-ground measurement device 10 and the output resistance value (R) of the resistance element 61 of the oscillation circuit 60, which are default values, to Expression (5). In this manner, the computation device 70 calculates the combined impedance ($Z_m$) of the electrostatic capacity ($C_h$) between the hand of the user U and the grip cable 30, the impedance ($Z_h$) of the user U, and the electrostatic capacity ($C_f$) between the sole of the foot of the user U and the upper electrode 11.

Step S204:

Subsequently, the computation device 70 determines whether or not there is as unmeasured frequency among the plurality of frequencies that are predetermined. When there is at least one unmeasured frequency, the process proceeds to step S205. On the contrary, when there is no unmeasured frequency, the process proceeds to step S207.

Step S204:

When there is at least one unmeasured frequency, the computation device 70 instructs the oscillation circuit 60 to output a signal of the next frequency.

Step S206:

After that, on the basis of the instruction from the computation device 70 to output the signal, the oscillation circuit 60 outputs the signal of the next frequency, and the process returns to step S203.

Step S207:

When there is no unmeasured frequency, the computation device 70 transmits the measured combined impedance ($Z_m$) of each of the frequencies to the voltage-to-ground measurement device 10 and thus ends the process.

Subsequently, the voltage-to-ground measurement device 10 has stored therein the frequency characteristics of the combined impedance ($Z_m$) of each user transmitted thereto from the computation device 70, so as to be kept in association with the ID of the user U. When the maintenance person U measures the voltage to ground of the electromagnetic noise, the voltage-to-ground measurement device 10 obtains the voltage to ground ($V_n$) of the electromagnetic noise for which the measurement error related to the individual difference of the human body has been corrected, by assigning the combined impedance ($Z_m$) of the maintenance person U to Expression (1) and changing the measured voltage ($V_m$) between the upper electrode 11 and the lower electrode 12 measured at the time of the measurement process.

Advantageous Effects of the Second Embodiment

According to the second embodiment, provided are: the grip cable 30 that is a conductor; the counter earth ground surface electrode 100 provided on the floor; the oscillation circuit 60 that is connected between the grip cable 30 and the counter earth ground surface electrode 100 and that outputs the signal; the voltage-to-ground measurement device 10 that includes the upper electrode 11 and the lower electrode 12 positioned apart from each other and that measures the voltage between the upper electrode 11 and the lower electrode 12; the capacitance-to-ground measurement device 20 that measures the capacitance to ground; and the computation device 70 that communicates with the voltage-to-ground measurement device 10 and the capacitance-to-ground measurement device 20. When the user U touches the grip cable 30 while wearing the shoes of which the sole of one shoe has the voltage-to-ground measurement device 10 installed therein and of which the sole of the other shoe has the capacitance-to-ground measurement device 20 installed therein, the computation device 70 calculates the combined impedance ($Z_m$) of the electrostatic capacity ($C_h$) between the hand of the user U and the grip cable 30, the impedance ($Z_h$) of the user U, and the electrostatic capacity ($C_f$) between the sole of the foot of the user U and the upper electrode 11, by using the voltage (V) of the signal output from the oscillation circuit 60, the voltage ($V_m$) between the upper electrode 11 and the lower electrode 12 measured by the voltage-to-ground measurement device 10, and the capacitance to ground values (=C and $C_a$) measured by the capacitance-to-ground measurement device 20. It is therefore possible to provide the technique that makes it possible to correct the measurement error related to the individual difference of the human body that functions as a probe at the time of measuring the voltage to ground of the electromagnetic noise. As a result, it is possible to measure the voltage to ground of the electromagnetic noise with a higher level of precision.

<Others>

The present invention is not limited to the embodiments described above and may be modified in various manners within the scope of the gist thereof.

Figure 13:
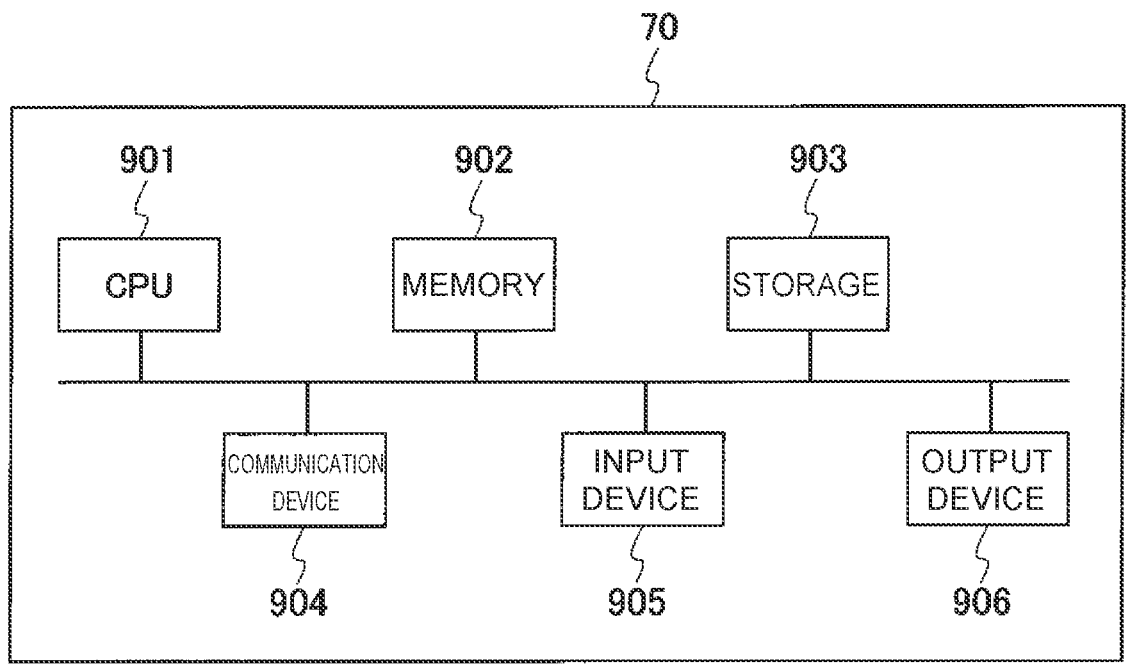
FIG. 13 is a drawing showing a hardware configuration of a computation device.

It is possible to realize the computation device 70 according to the first embodiment and the second embodiment by using, for example, a generic computer system including a central processing unit (CPU) 901, a memory 902, a storage 903 (a hard disk drive [HDD] and/or a solid state drive [SSD]), a communication device 904, an input device 905, and an output device 906, as shown in FIG. 13. The memory 902 and the storage 903 are each a storage device. In the computer system, as a result of the CPU 901 executing a prescribed program loaded into the memory 902, various functions of the computation device 70 are realized.

Further, the computation device 70 may be implemented by a single computer or may be implemented by two or more computers. Further, the computation device 70 may be a virtual machine installed in a computer. The program used by the computation device 70 may be stored in a computer-readable recording medium such as an HDD, an SSD, a Universal Serial Bus (USB) memory, a compact disc (CD), or a digital versatile disc (DVD) and may be distributed via a network.

REFERENCE SIGNS LIST

- 10 Voltage-to-ground measurement device
- 11 Upper electrode
- 12 Lower electrode
- 13 Voltage measurement circuit
- 20 Capacitance-to-ground measurement device
- 21 Upper electrode
- 22 First lower electrode
- 23 Second lower electrode
- 24 Oscillation circuit
- 25 Resistance element
- 26 Voltage measurement circuit
- 30 Grip cable
- 40 Floor gavel
- 50 Height adjustment table
- 60 Oscillation circuit
- 61 Resistance element
- 62 Oscillator
- 70 Computation device
- 80 Pedestal
- 90 Desk
- 100 Counter earth ground surface electrode
- 901 CPU
- 902 Memory
- 903 Storage
- 904 Communication device
- 905 Input device
- 906 Output device

The invention claimed is:

1. A measurement individual difference correction system for measuring voltage to ground, comprising:
    a cable comprising a conductor;
    a floor panel provided on a floor and comprising a conductor;
    an oscillation circuit connected between the cable and the floor panel, and configured to output a signal;
    a voltage-to-ground measurement device comprising an upper electrode and a lower electrode positioned apart from each other, and configured to measure voltage between the upper electrode and the lower electrode; and
    a computation device in communication with the voltage-to-ground measurement device,
    wherein when a user stands on the floor panel with the lower electrode directly connected to the floor panel and the user touches the cable while wearing a shoe of which a sole comprises the voltage-to-ground measurement device installed therein, the computation device calculates combined impedance of electrostatic capacity between the user and the cable, impedance of the user, and electrostatic capacity between the user and the upper electrode, by using voltage of the signal output from the oscillation circuit and the voltage between the upper electrode and the lower electrode measured by the voltage-to-ground measurement device.

2. The measurement individual difference correction system for measuring the voltage to ground according to claim 1, further comprising:
    a height adjustment table comprising a conductor, wherein the height adjustment table is provided on the floor, is taller than the floor panel, and is electrically connected to the floor panel,
    wherein the oscillation circuit is connected between the cable and the height adjustment table, and is not connected between the cable and the floor panel.

3. The measurement individual difference correction system for measuring the voltage to ground according to claim 1, wherein
    the voltage-to-ground measurement device has stored therein the combined impedance of each of users, and
    when a prescribed one of the users measures voltage to ground of electromagnetic noise propagating through the cable subject to a measurement process, the voltage-to-ground measurement device calculates the voltage to ground of the electromagnetic noise, by changing the voltage between the upper electrode and the lower electrode measured at a time of the measurement process, with use of the combined impedance of the prescribed user.

4. A measurement individual difference correction system for measuring voltage to ground, comprising:
    a cable comprising a conductor;
    a counter earth ground surface electrode provided on a floor;
    an oscillation circuit connected between the cable and the counter earth ground surface electrode, and configured to output a signal;
    a voltage-to-ground measurement device comprising an upper electrode and a lower electrode positioned apart from each other, and configured to measure voltage between the upper electrode and the lower electrode;
    a capacitance-to-ground measurement device configured to measure capacitance to ground; and a computation device in communication with the voltage-to-ground measurement device and the capacitance-to-ground measurement device, wherein when a user touches the cable while wearing shoes of which a sole of one shoe comprises the voltage-to-ground measurement device installed therein and of which a sole of the other shoe comprises the capacitance-to-ground measurement device installed therein, the computation device calculates combined impedance of electrostatic capacity between the user and the cable, impedance of the user, and electrostatic capacity between the user and the upper electrode, by using voltage of the signal output from the oscillation circuit, the voltage between the upper electrode and the lower electrode measured by the voltage-to-ground measurement device, and the capacitance to ground measured by the capacitance-to-ground measurement device.

5. The measurement individual difference correction system for measuring the voltage to ground according to claim 4, wherein the voltage-to-ground measurement device has stored therein the combined impedance of each of users, and when a prescribed one of the users measures voltage to ground of electromagnetic noise propagating through the cable subject to a measurement process, the voltage-to-ground measurement device calculates the voltage to ground of the electromagnetic noise, by changing the voltage between the upper electrode and the lower electrode measured at a time of the measurement process, with use of the combined impedance of the prescribed user.

\* \* \* \* \*